United States Patent [19]

Jean et al.

[11] Patent Number: 5,118,643
[45] Date of Patent: Jun. 2, 1992

[54] LOW DIELECTRIC INORGANIC COMPOSITION FOR MULTILAYER CERAMIC PACKAGE CONTAINING TITANIUM SILICATE GLASS

[75] Inventors: Jau-Ho Jean, Export; Tapan K. Gupta, Monroeville, both of Pa.

[73] Assignee: Aluminum Company of America, Pittsburgh, Pa.

[21] Appl. No.: 603,218

[22] Filed: Oct. 25, 1990

[51] Int. Cl.$^5$ .................... C03C 8/24; C03C 8/02; C03C 8/18; H01B 1/06

[52] U.S. Cl. .................... 501/21; 501/16; 501/18; 501/49; 501/61; 501/133; 501/134; 252/520; 428/210; 428/210

[58] Field of Search .............. 501/18, 21, 49, 52, 501/61, 134, 136, 62; 252/512, 518, 520; 428/210, 901

[56] References Cited

U.S. PATENT DOCUMENTS

| | | | |
|---|---|---|---|
| 3,926,648 | 12/1975 | Miller | 106/39.6 |
| 4,169,001 | 9/1979 | Kaiser | 156/89 |
| 4,547,625 | 10/1985 | Tosaki et al. | 174/68.5 |
| 4,567,542 | 1/1986 | Shimada et al. | 361/321 |
| 4,642,148 | 2/1987 | Kurihara et al. | 156/89 |
| 4,672,152 | 6/1987 | Shinohara et al. | 174/68.5 |
| 4,724,021 | 2/1988 | Martin et al. | 156/89 |
| 4,755,490 | 7/1988 | DiLizzaro | 501/17 |
| 4,788,046 | 11/1988 | Barringer et al. | 423/122 |
| 4,849,379 | 7/1989 | McCormick | 501/20 |
| 4,879,261 | 11/1989 | Burn | 501/32 |

*Primary Examiner*—William R. Dixon, Jr.
*Assistant Examiner*—Michael A. Marcheschi
*Attorney, Agent, or Firm*—David W. Pearce-Smith

[57] ABSTRACT

A ceramic composition for forming a ceramic dielectric body having a dielectric constant of less than about 4.2 at 1 MHz and a linear thermal expansion coefficient of 2.5–3.0 ppm/° C. from room temperature to 200° C. The composition comprises a mixture of finely divided particles of 25–50 vol. % borosilicate glass and 50–75 vol. % titanium silicate glass. The composition can be used with a polymeric binder to produce an unfired green tape which is co-fireable with high conductivity metallurgies such as gold, silver and silver/palladium.

14 Claims, No Drawings

LOW DIELECTRIC INORGANIC COMPOSITION FOR MULTILAYER CERAMIC PACKAGE CONTAINING TITANIUM SILICATE GLASS

FIELD OF THE INVENTION

The invention relates to dielectric compositions. More particularly the invention relates to glass and ceramic materials that are sintered at low temperatures to produce dense bodies having low coefficients of thermal expansion and a dielectric constant below 4.2.

BACKGROUND OF THE INVENTION

Conventionally, alumina ($Al_2O_3$) is used as a dielectric material for microelectronic packages. It has excellent electrical (insulating), thermal and mechanical (especially strength) properties. Alumina based packages generally containing 4–10 wt.% glass, require sintering temperatures above 1500° C., which necessitates the use of refractory metals such as molybdenum or tungsten for the electrical interconnections so that the metal can be co-fired with the package. These metals have poor electrical conductivity as compared to highly conductive metals such as copper, and secondly, they require the use of strongly reducing atmospheres during co-firing necessitating, expensive furnace systems.

The development of multilayer ceramic circuit boards is toward higher frequency, higher density and higher speed devices. $Al_2O_3$ has a relatively high dielectric constant of about 9.9, causing high signal propagation delay and low signal-to-noise ratio (crosstalk). The signal propagation delay (t) in ceramic substrates is affected by the effective dielectric constant of the substrate (k,) in the following equation:

$$t = (k')^{0.5}/C$$

where C is the speed of light. It can be found that the signal propagation delay can be dramatically reduced by a reduction in the effective dielectric constant of the substrate. For example, a if the dielectric constant of a material is reduced from 10 (approximately the k' of $Al_2O_3$) to 5, the signal propagation delay can be reduced by 30%. A small signal delay is especially important for the substrate housing a chip with a very dense integrated circuit, for instance, very high speed integrated circuit.

Furthermore, alumina has a coefficient of thermal expansion of about $7.4 \times 10^{-6}$/° C. (in the 20°–200° C. range) as compared to $3.4 + 10^{-6}$/° C. for silicon. This mismatch in thermal expansion results in design constraints and reliability concerns when attaching a silicon wafer to the substrate.

Heretofore, most of the dielectric materials used in multilayer circuits have been conventional thick film compositions. A typical circuit is constructed by sequentially printing, drying and firing functional thick film layers atop a ceramic substrate which is usually 92–96 wt.% $Al_2O_3$. The multiple steps required make this technology process intensive with the large number of process steps and yield losses contributing to high costs. Thick film technology nevertheless fills an important need in microelectronics and will continue to do so in the foreseeable future.

Recently, dielectric thick film compositions with low dielectric constant have been introduced. However, ceramic substrates with low dielectric constants less than 4.5 and thermal expansion coefficients equal to that of silicon (3.4 ppm/° C.) are not readily available.

Low temperature co-fired (LTCF) technology has been recently introduced as a method for fabricating multilayer circuits. This technology offers the combination of the processing advantages of HTCF technology and the materials advantages of thick film technology. These LTCF tape systems have firing temperatures below 1000° C. and allow the use of high conductivity metals such as silver, gold, silver/palladium and copper (copper, however, requires reducing atmospheres). Most of these tape systems have dielectric constants between 6 and 8 and encompass a range of thermal coefficient of expansion (TCE).

Currently, there is no readily available low temperature co-fired dielectric tape system using a glass plus ceramic approach that offers both low dielectric constant (less than 4.5) and a TCE matched to silicon (3.4 ppm/° C.).

PRIOR ART

A method for producing a multilayer ceramic circuit board for use with copper conductors is described in U.S. Pat. 4,642,148 issued to Kurihara et al. Ceramic compositions comprising 10–75 wt.% alpha-alumina, 5–70 wt.% non-crystalline quartz (fused silica), 20–60 wt.% borosilicate glass are disclosed. The dielectric constants of the fired materials ranged from 4.8 to 9.6.

U.S. Pat. No. 4,672,152 issued to Shinohara et al describes a multilayer ceramic circuit board in which the ceramic is prepared from a mixture of 50–95 wt.% crystallizable glass and 5–50 wt.% ceramic filler. The material has a dielectric constant between 5.1 and 6.0 and a flexural strength above 150 MPa. The crystallizable glass consists of 5–20 wt.% lithium oxide, 60–90 wt.% silicon dioxide, 1–10 wt.% aluminum oxide and 1–5 wt.% alkaline metal oxide other than lithium oxide. The ceramic filler is selected from the group of silicon dioxide, $\beta$-eucryptite ($LiAlSiO_4$) and aluminum oxide.

U.S. Pat. No. 4,755,490 issued to DiLazzaro describes a low firing temperature ceramic materials having dielectric constants between 4.5 and 6.1. The materials had coefficient of thermal expansion between 3.9 and 4.2 cm/cm/° C. x $10^{-6}$. Example 11 shows k'=4.5 and TCE=3.9. The material is formed from a mixture of 10–50 wt.% alumina, 0–30 wt.% fused silica and 50–60 wt.% (approximately 60–70 vol.%) of a frit composed of about 4 wt.% CaO, about 12 wt.% MgO, about 29 wt.% $B_2O_3$, and about 42 wt.% $SiO_2$. The compositions are fired at a temperature below 1000° C.

U.S. Pat. No. 4,788,046 issued to Barringer et al describes a glass-ceramic packages for integrated circuits having low sintering temperature. The sintered compositions are formed by coating ceramic particles with glass, separating the coated particles from the glass and then forming the coated particles into a green compact. The material with the lowest dielectric constant (4.5) is obtained using quartz. This material has had a thermal expansion coefficient greater than 5.5.

U.S. Pat. No. 4,879,261 issued to Burn describes a low dielectric material having a dielectric less than 5.0. The material is formed from a mixture of finely divided particles consisting essentially of 70–85 wt.% silica and 15–30 wt.% zinc borax flux which is fired to 1065° C. in an oxidizing atmosphere. The composition can be used to make green tape and multilayer devices having internal copper conductors such as multilayer capacitors and multilayer interconnects.

From the foregoing, it can be seen that there is a substantial need for a low temperature co-fireable tape dielectric which (1) has a low dielectric constant (less than 4.5), (2) has a thermal expansion coefficient very close to the value for silicon (3.4 ppm/° C.), and (3) can be fired in air at a low temperature (less than 950° C.), thus permitting the use of high conductivity metallurgies such as gold, silver and silver/palladium.

The principal object of the invention is to provide a material that can be sintered into a body that has a dielectric constant of less than 4.2, a thermal expansion coefficient below 4.0 ppm/° C.), and can be fired in air at temperatures less than 950° C.

Another object of the invention is to provide ceramic materials that are sintered at low temperatures to produce dense bodies (greater than 95% of theoretical density) having low coefficients of thermal expansion and a dielectric constant below 4.2 and have a glass content below 50 vol.%. A reduction in the glass content of the sintered body is very desirable in that the glassy phase is responsible for shape distortion or warpage during co-firing. If the sintered body is to be used in an electronic package, the shape distortion associated with high volume percent glass content can cause the via holes to misalign during co-firing of the metal and ceramic. A glass content below 50 vol.% will reduce the likelihood that warpage will occur.

SUMMARY OF THE INVENTION

The invention is directed to a ceramic composition for forming a ceramic dielectric body having a dielectric constant of less than about 4.2, the composition being co-fireable with high conductivity metals such as gold, silver and silver/palladium. The composition comprises a mixture of finely divided particles of 25-50 vol.% borosilicate glass and 50-75 vol.% titanium silicate glass.

In a second aspect, the invention is directed to an unfired green tape comprising the above composition dispersed in a polymeric binder.

In a further aspect, the invention is directed to a multilayer ceramic substrate comprising layers of the above composition and interconnected conductor layers of copper therebetween, the assemblage having been fired to form a dense hermetic structure.

In a yet another aspect, the invention is directed to a multilayer ceramic capacitor comprising layers of the above composition with conductor layers of copper therebetween, the assemblage having been fired to form a dense hermetic structure.

DETAILED DESCRIPTION OF THE INVENTION

The preferred glass plus ceramic composition of the present invention comprises a mixture of two principal components: borosilicate glass and titanium silicate glass. The percentages of each component may be varied within the ranges delineated below, depending on the final desired properties of the fired ceramic material. Dense ceramic bodies can be formed from such compositions by normal manufacturing techniques and low temperature (i.e., 850-1000° C.) sintering. In a preferred application of the invention, such a mixture is formed into a thin tape, via holes punched through the tape at desired locations, and one or more metal conductor paths are formed on the punched tape. Suitable metals for the conductor paths include copper, silver, gold, platinum/gold and palladium/silver. The tape is subsequently sintered at low temperature, typically after two or more sections have been laminated together to form a multilayer circuit substrate.

Surprisingly, it has been found that low firing temperature glass plus ceramic compositions can be made from mixtures containing less than 50 vol.% borosilicate glass. As stated above, a reduction in the glass content of the sintered body is very desirable in that the glassy phase is responsible for shape distortion or warpage during co-firing. A glass content below 50 vol.% will reduce the likelihood that warpage and misalignment of via holes will occur. Low firing temperature glass plus ceramic compositions of the invention are produced by providing a mixture of powdered ingredients, including 25-50 vol.% borosilicate glass and 50-75 vol.% titanium silicate glass, the borosilicate glass being composed of $Al_2O_3$, $B_2O_3$, $CaO$, $K_2O$, $Li_2O$, $Na_2O$ and $SiO_2$ in amounts such that the mixture has a softening point of 793° C. A quantity of the mixture is then formed into a desired shape using conventional procedures, and sintered at a temperature of at least 850° C., preferably 850-950° C., and most preferably 900-950° C. The sintering may be conducted in an oxidizing, neutral or reducing atmosphere.

The term "ceramic" is used herein to describe inorganic compositions which do not soften at temperatures of less than about 1000° C.

The term "glass" is used herein to describe ceramic compositions which melt and form a glassy phase at temperature of less than about 1000° C.

The term "glass plus ceramic" is used herein to describe a sintered ceramic composition which is formed from a mixture of ceramic and glass. The ceramic and glass phases of the "glass plus ceramic" composition remain distinct after firing. The glass in a "glass plus ceramic" system retains its glassy characteristic after firing and is said to be a noncrystallizable glass in that composition. The ceramic in a "glass plus ceramic" system need not be a crystalline material; it may also be a glass. The ceramic, whether glassy or crystalline in nature, does not soften during sintering and retains its initial characteristic after firing and is said to behave as a ceramic in that fired composition. The term "glass plus ceramic" is used herein to distinguish systems containing non-crystallizable glasses from "glass-ceramic" systems in which the glass undergoes a controlled devitrification during firing and becomes crystalline.

The term "borosilicate glass" is used herein to describe a family of glasses containing 20-35 wt.% boron oxide ($B_2O_3$) and 60-80 wt.% silicon oxide ($SiO_2$).

The term "titanium silicate glass" is used herein to describe a family of glasses containing 93 wt.% silicon oxide ($SiO_2$) and 7 wt.% $TiO_2$. "Titanium silicate glass" has a softening point of about 1500° C. Since the "titanium silicate glass" does not soften when fired to temperatures below about 1000° C., it can therefore be said to behave like a crystalline filler. Thus, the use of "titanium silicate glass" will not contribute to shape distortion or warpage during co-firing. As stated above, the shape distortion associated with high volume percent glass content can cause the via holes in the electronic package to misalign during co-firing of the metal and ceramic.

In addition to the "titanium silicate glass" being refractory, it does not normally devitrify when used in a ceramic composition which is fired below 1000° C. In this regard, "titanium silicate glass", which contains about 93 wt.% $SiO_2$, is different from "fused silica glass" which is virtually 100% $SiO_2$. For the purposes of the current invention, this difference between "titanium silicate glass" and "fused silica glass" is critical. A "fused silica glass" has a stronger tendency to devitrify and form crystallites of cristobalite at elevated temperatures than does a "titanium silicate glass".

The cristobalite and quartz phases formed during firing remains in the material on cooling. Cristobalite has a TCE of about $50 \times 10^{-6}/°$ C. (in the 20°–300° C. range) and quartz has a TCE of about $13 \times 10^{-6}/°$ C. as compared to $3.5 \times 10^{-6}/°$ C. for silicon. The presence of cristobalite and/or quartz in the fired product raises the TCE and lowers the mechanical strength of the product. The loss of mechanical strength is due to the volume change associated with phase transformation which generates microcracks. "Titanium silicate glass" will not normally form cristobalite crystallites when it is fired to temperatures below about 1000° C.

The term "finely divided" is used herein to describe a material that are ground to less than about 5 microns in size.

The glasses can be prepared by conventional glass-making techniques by mixing the desired components in the desired proportions and heating the mixture to form melt. As is well known in the art, heating is conducted to a peak temperature and for a time such that the melt becomes entirely liquid and homogeneous.

The above-described glasses are particularly desirable for use in electronic packages, such as VLSI applications, because of their low polarizability and thus low dielectric constant. Because borosilicate glasses by themselves tend to have low softening points, it is necessary to increase the softening point by the addition of large amounts of a other glasses which have high $SiO_2$ concentrations. Titanium silicate glasses are more durable than those with high $B_2O_3$ concentrations.

A preferred borosilicate glass comprises about 0–1 wt.% $Al_2O_3$, 25–30 wt.% $B_2O_3$, 0–1 wt.% CaO, 0–1 wt.% $K_2O$, 0–1 wt.% $Li_2O$, 0–1 wt.% $Na_2O$, 0–0.5 wt.% $ZnO \cdot B_2O_3$ and 65–75 wt.% $SiO_2$. The amount of borosilicate glass used affects the sintering temperature. If too little borosilicate glass is used (for example, less than about 25 vol.% in this embodiment), the sintering temperature will be too high to achieve the benefits of the present invention. Maintaining the proportion of borosilicate glass within the range of about 25–50 vol.% is necessary to obtain these benefits.

A preferred titanium silicate glass composition is sold under the tradename Corning 7971 and contains 7 wt.% $TiO_2$ and 93 wt.% $SiO_2$.

The following examples illustrate preferred ranges of components of the glass plus ceramic compositions of the invention. In each example, the borosilicate glass is comprised of 0.98 wt.% $Al_2O_3$, 26.7 wt.% $B_2O_3$, 0.11 wt.% CaO, 0.84 wt.% $K_2O$, 0.78 wt.% $Li_2O$, 0.2 wt.% $Na_2O$ and 69.8 wt.% $SiO_2$ and the titanium silicate glass is Corning's 7971.

EXAMPLE 1

In this example, the starting materials consisted essentially of 80 vol.% titanium silicate glass and 20 vol.% borosilicate glass. The borosilicate glass and the titanium silicate glass were separately ground in a 1.3 gallon ball mill for 16 hours to achieve a particle size of 2–4 microns. Since the density of the borosilicate glass (2.16 gm/cc) and the titanium silicate glass (2.21 gm/cc) are approximately the same, the volume percent is roughly equivalent to the wt.%. In this example the actual wt.% of the mixture is 80.4 wt.% titanium silicate glass and 19.6 wt.% borosilicate glass. This mixture of inorganic material was combined with 5 wt.% polyethylene glycol binder and 50 wt.% 1-propanol and mixed for 2 hours in a tubular mixer. The material was then oven dried at 80° C. for 2 hours and screened. The material was then dry pressed into 1.9 cm diameter, 0.3 cm high pellets by compressing the milled mixture in a mold at 13,000 psi (910 kg/cm$^2$). The pellets were then fired in air. The firing was in two steps. The first step was to burn the binder out. This was accomplished by heating the pellets to 500° C. and holding for 1 hour. Next the pellets were sintered isothermally at various temperatures ranging from 900° C. to 1000° C. for four hours. The sintered density of the sintered materials were determined by the water replacement method, according to ASTM procedure C373-72. Thermal expansion coefficients (TCE) were determined in the temperature range from room temperature to 200° C. by using a dilatometer. Dielectric constant and dielectric loss were determined by an HP 4192 AC impedance at 1 MHz. In Table 1, the sintered density of the material is reported as the percentage of theoretical density, which is calculated based upon mixing rule. It is found that the resulting sintered ceramic material is always less than 95% theoretical density (T.D.) at temperatures ranging from 900° to 1000° C. X-ray analysis showed only a nominal amount of crystalline phase present in the sintered body.

EXAMPLE 2

The procedure of Example 1 repeated except that the inorganic composition was 70 vol.% titanium silicate glass, 30 vol.% borosilicate glass (70.5 wt.% and 29.5 wt.%, respectively). The sintered density of the material is reported in Table 1. The resulting sintered ceramic compacts have a density greater than 95% theoretical density (T.D.) only at temperatures greater than 975° C. X-ray analysis showed only a nominal amount of crystalline phase present in the sintered body.

EXAMPLE 3

The procedure of Example 1 repeated except that the inorganic composition was 60 vol.% titanium silicate glass, 40 vol.% borosilicate glass (60.5 wt.% and 39.5 wt.%, respectively). The sintered density of the material is reported in Table 1. The resulting sintered ceramic material was determined to have a density greater than 95% theoretical density (T.D.) at temperatures greater than 900° C. The dielectric constant (k'), dissipation factor (D.F.) and linear thermal coefficient of expansion (TCE) of the material are recorded in Table 2. X-ray analysis showed only a nominal amount of crystalline phase present in the sintered body.

EXAMPLE 4

The procedure of Example 1 repeated except that the inorganic composition was 50 vol.% titanium silicate glass, 50 vol.% borosilicate glass (50.6 wt.% and 49.4 wt.%, respectively). The sintered density of the material is reported in Table 1. The resulting sintered ceramic material was determined to have a density greater than 95% theoretical density (T.D.) at temperatures greater than 900° C. X-ray analysis showed only a nominal amount of crystalline phase present in the sintered body.

EXAMPLE 5

The procedure of Example 1 repeated except that the inorganic composition was 60 vol.% fused silica and 40 vol.% borosilicate glass (60.4 wt.% and 39.6 wt.%, respectively). The sintered density of the material is reported in Table 1. It is found that the sintered density is always less than 85% theoretical density at temperatures investigated. XRD analysis showed cristobalite was present. This indicates that the original amorphous binary mixture devitrified during densification.

EXAMPLE 6

The procedure of Example 1 repeated except that the inorganic composition was 60 vol.% quartz and 40 vol.% borosilicate glass (60.6 wt.% and 39.4 wt.%, respectively). The sintered density of the material is reported in Table 1. It is found that the sintered density is always less than 95% theoretical density at temperatures investigated.

TABLE 1

| Ex- ample | Composition (Vol. %) | | | | Temperature (°C.) | | | | |
|---|---|---|---|---|---|---|---|---|---|
| | BSG | TSG | FS | Ou | 900 | 925 | 950 | 975 | 1000 |
| | | | | | Sintered Density (% TD) | | | | |
| 1 | 20 | 80 | 0 | 0 | 71 | 74 | 75 | 91 | 92 |
| 2 | 30 | 70 | 0 | 0 | 80 | 85 | 86 | 97 | 98 |
| 3 | 40 | 60 | 0 | 0 | 95 | 97 | 98 | 98 | 98 |
| 4 | 50 | 50 | 0 | 0 | 98 | 99 | 98 | — | — |
| 5 | 40 | 0 | 60 | 0 | 80 | — | 85 | — | — |
| 6 | 40 | 0 | 0 | 60 | 93 | — | 93 | — | — |

TABLE 2

| Example | Composition (Vol. %) | | °C. | k' | D.F. (%) | TCE (ppm/c) |
|---|---|---|---|---|---|---|
| | BSG | TSG | | | | |
| 3 | 40 | 60 | 925 | 3.98 | <0.3 | 2.55 |

Note:
BSG - borosilicate glass
TSG - titanium silicate glass
FS - fused silica
Qu - quartz The products of Examples 2-4 contain a low glass content (30-50 vol.%) which is much less than those reported in the literature (greater than 60 vol.%). A low glass content is very desirable, because the shape distortion can be avoided during co-firing. The products of Examples 2-4 had high sintered densities (greater than 95% of the theoretical density) obtained at temperatures of 900-950° C. in air. The sintering temperatures are compatible with those of precious metals, e.g., Au and Ag-Pd, which will enable the compositions to be utilized in a co-firable ceramic/metal electronic packaging system.

In addition, the material of Example 3 has low dielectric constants (3.8-4.1) and low dielectric losses (0.1-0.4% at 1 MHz) which are very desirable to reduce the signal propagation delay in the ceramic substrate.

The materials of Examples 2-4 can be used to form multilayer high frequency circuit packages. To form dielectric layers for multilayer high frequency circuit packages, the starting materials are ground in a ball mill until they have an average particle size of 2-4 microns. A slurry is then formed by combining the finely ground powder with a suitable solvent and other conventional additives, such as a plasticizer and a binder, in a manner known in the art. The slurry is cast into thin "green" (unfired) sheets having a thickness of about 75 to 400 microns using a conventional doctor blading process, after which the green sheets are blanked into individual 125 mm square sheets or tapes. Via holes next are formed in the green sheets by a die punching process. The holes suitably may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50-100° C. under a pressure between about 35 and 250 kg/cm$^2$. Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is the case, for example, with the metals named above, except for copper, which requires a reducing or neutral atmosphere. Sheets formed in the manner described will have a lower glass content (25-50 vol.%) and therefore a lower tendency to bow or warp.

The compositions of the present invention also can be used to form rigid, nonporous ceramic bodies by substantially conventional techniques. For example, the batch ingredients of any of the previous examples are combined with water and organic binders, and ball milled for a period of about 20 hours. The resulting slurry is spray dried to provide a powder of substantially spherical particles. This powder can be used to form bodies of various desired shapes by standard forming techniques, such as dry or isostatic pressing. The bodies are then fired at a suitable temperature not exceeding 1000° C. to provide dense, sintered ceramic objects.

Although the invention has been described in terms of a titanium silicate glass, it is contemplated that other forms of silica may be used in practicing the present invention. However, it is not believed that quartz and/or cristobalite can be used because of their high TCE. In addition, it is not desirable to use fused silica that will devitrify when fired to temperatures of up to 1000° C. Moreover, the results given in Examples 5 and 6 show that the compositions with a ceramic filler, e.g., fused silica or quartz, cannot be densified to a sintered density greater than 95% theoretical density at temperatures of interest.

It will be apparent to those skilled in the relevant art that various changes and modifications may be made in the embodiments described above to achieve the same or equivalent results without departing from the principles of the present invention as described and claimed herein. All such changes and modifications are intended to be covered by the following claims.

What is claimed is:

1. A ceramic composition for forming a ceramic dielectric body having a dielectric constant of less than about 4.2, said composition comprising a mixture of finely divided particles of:
   (a) 25-50 vol.% borosilicate glass; and
   (b) 50-75 vol.% titanium silicate glass.

2. The ceramic composition of claim 1 in which the borosilicate glass has the composition:

0-3 wt.% Al$_2$O$_3$, 20-30 wt.%, B$_2$O$_3$, 0-3 wt.% CaO, 0-3 wt.% K$_2$O, 0-3 wt.% Li$_2$O, 0-3 wt.% Na$_2$O, and 60-80 wt.% SiO$_2$.

3. The ceramic composition of claim 1 in which the titanium silicate glass has the composition:
   1-20 wt.% titania, 80-99 wt.% SiO$_2$, and the remainder incidental impurities.

4. The ceramic composition of claim 1 wherein the formed ceramic dielectric body has a thermal expansion coefficient in the range of about 2.5-3.0 ppm/° C.

5. The ceramic composition of claim 1 in which the mixture of finely divided particles is dispersed in an organic medium.

6. The ceramic composition of claim 5 in which the organic medium is comprised of a polymeric binder dissolved in an organic solvent.

7. The ceramic composition of claim 6 in which the organic solvent is a volatile solvent and the dispersion is of castable consistency.

8. A castable ceramic composition comprising:
   (a) mixture of 25-50 vol.% borosilicate glass and 50-75 vol.% titanium silicate glass;
   (b) 15-30 wt.% of an organic medium comprised of a polymeric binder dissolved in, an organic solvent.

9. A method of making a ceramic dielectric body having a dielectric constant of less than about 4.2, comprising the steps of;
   (a) providing a mixture consisting essentially of finely divided particles of comprising 25-50 vol.% borosilicate glass and 50-75 vol.% titanium silicate glass; and
   (b) sintering the mixture in air to a temperature not greater than about 1000° C.

10. The method of claim 9 in which the borosilicate glass has the composition:
    0-3 wt.% Al$_2$O$_3$, 20-30 wt.%, B$_2$O$_3$, 0-3 wt.% CaO, 0-3 wt.% K$_2$O, 0-3 wt.% Li$_2$O, 0-3 wt.% Na$_2$O, and 60-80 wt.% SiO$_2$.

11. The method of claim 9 in which the titanium silicate glass has the composition:
    1-20 wt.% titania, 80-99 wt.% SiO$_2$, and the remainder incidental impurities.

12. A multilayer ceramic circuit board formed of a plurality of laminated ceramic circuit board units, each unit including a ceramic insulating layer, a patterned electrical conductor layer supported on said ceramic insulating layer and through hole electrical conductors for connecting said patterned electrical conductor layers of said respective ceramic circuit board units to form a wiring circuit, said electrical conductor layers and said through hole electrical conductors selected from the group of gold, silver and palladium said ceramic insulating layer comprising:
    a sintered mixture of 25-50 vol.% borosilicate glass and 50-75 vol.% titanium silicate glass, said ceramic insulating layer sintered at a temperature below the melting temperature of said patterned electrical conductor layers and said through hole electrical conductors.

13. The ceramic composition of claim 12 in which the borosilicate glass has the composition:
    0-3 wt.% Al$_2$O$_3$, 20-30 wt.%, B$_2$O$_3$, 0-3 wt.% CaO, 0-3 wt.% K$_2$O, 0-3 wt.% Li$_2$O, 0-3 wt.% Na$_2$O, and 60-80 wt.% SiO$_2$.

14. The ceramic circuit board of claim 12 in which the titanium silicate glass has the composition:
    1-20 wt.% titania, 80-99 wt.% SiO$_2$, and the remainder incidental impurities.

* * * * *

UNITED STATES PATENT AND TRADEMARK OFFICE
CERTIFICATE OF CORRECTION

PATENT NO.   : 5,118,643

DATED        : June 2, 1992

INVENTOR(S)  : Jau-Ho Jean and Tapan K. Gupta

It is certified that error appears in the above-identified patent and that said Letters Patent is hereby corrected as shown below:

Col. 10, line 27    Change "composition" to --circuit board--.
Claim 13

Signed and Sealed this

Seventh Day of December, 1993

Attest:

BRUCE LEHMAN

Attesting Officer    Commissioner of Patents and Trademarks